(12) United States Patent
Wang et al.

(10) Patent No.: US 6,541,338 B2
(45) Date of Patent: Apr. 1, 2003

(54) LOW DEFECT DENSITY PROCESS FOR DEEP SUB-0.18 μM FLASH MEMORY TECHNOLOGIES

(75) Inventors: Zhigang Wang, San Jose, CA (US); Yue-Song He, San Jose, CA (US); Richard Fastow, Cupertino, CA (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 0 days.

(21) Appl. No.: 09/917,182

(22) Filed: Jul. 30, 2001

(65) Prior Publication Data

US 2003/0022440 A1 Jan. 30, 2003

(51) Int. Cl.$^7$ .......................................... H01L 21/8247
(52) U.S. Cl. ..................... 438/258; 438/264; 438/529
(58) Field of Search ................................. 438/201, 211, 438/257, 258, 264, 527, 529, 530, 545

(56) References Cited

U.S. PATENT DOCUMENTS

| | | | |
|---|---|---|---|
| 6,337,250 B2 * | 1/2002 | Furuhata | 438/257 |
| 6,395,592 B1 * | 5/2002 | Wu | 438/201 |
| 2001/0008786 A1 * | 7/2001 | Tsukiji | 438/257 |

* cited by examiner

Primary Examiner—Chandra Chaudhari

(57) ABSTRACT

A method of forming flash memory EEPROM devices having a low energy source implant and a high-energy $V_{SS}$ connection implant such that the intrinsic source defect density is reduced and the $V_{SS}$ resistance is low. The source regions are implanted with a low energy, low dosage dopant ions and the $V_{SS}$ regions are implanted with a high energy, high dosage dopant ions.

4 Claims, 2 Drawing Sheets

LOW DEFECT DENSITY PROCESS FOR DEEP SUB-0.18 µM FLASH MEMORY TECHNOLOGIES

BACKGROUND OF THE INVENTION

1. Field of the Invention

This invention relates generally to the art of microelectronic integrated circuits. More specifically, this invention relates to high performance microelectronic flash memory cells and to the art of manufacturing high performance microelectronic flash memory cells. Even more specifically, this invention relates to a method of manufacturing high performance microelectronic flash memory cells with low defect density.

2. Discussion of the Related Art

A microelectronic flash or block erase Electrically Erasable Programmable Read-Only Memory (Flash EEPROM) includes an array of cells that can be independently programmed and read. The size of each cell and thereby the memory array are made small by omitting transistors known as select transistors that enable the cells to be erased independently. As a result, all of the cells are erased together as a block.

A memory of this type includes individual Metal-Oxide-Semiconductor (MOS) field effect transistor memory cells, each of which includes a source, a drain, a floating gate and a control gate to which various voltages are applied to program the cell with a binary 1 or 0, or to erase all of the cells as a block.

The cells are connected in an array of rows and columns, with the control gates of the cells in a row being connected to a respective wordline and the drains of the cells in a column being connected to a respective bitline. The sources of the cells in a either a column or a row are connected together and each column or row common source connections are then connected to a common source voltage $V_{SS}$. This arrangement is known as a NOR flash memory configuration.

A cell is programmed by applying a voltage, typically 9 volts to the control gate, applying a voltage of approximately 5 volts to the drain and grounding the common voltage source $V_{SS}$, which causes hot electrons to be injected from a drain depletion region into the floating gate. Upon removal of the programming voltages, the injected electrons are trapped in the floating gate and create a negative change therein which increases the threshold voltage of the cell to a value in excess of approximately 4 volts.

A cell is read by applying typically 5 volts to the control gate, applying 1 volt to the bitline to which the drain is connected, grounding the common source voltage $V_{SS}$, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, a cell is erased by applying a relatively high voltage, typically 12 volts, to the source, grounding the control gate and allowing the drain to float. This causes the electrons that were injected into the floating gate during programming to undergo Fowler-Nordheim tunneling from the floating gate through the thin tunnel oxide layer to the source. A cell can also be erased by applying a negative voltage on the order of −10 volts to the control gate, applying 5 volts to the source and allowing the drain to float. Another method of erasing is by applying 5V to the P-well and −10V to the control gate while allowing the source/drain to float.

However, as the dimensions of the flash memory array have been aggressively scaled down and the product arrays produced with ultra high density, one important yield factor for deep sub-0.18 µm high performance non-volatile memory cell is the high defect density from the heavily-damaged source junction due to the high energy source implant.

Therefore, what is needed is a method of providing a low energy source implant and a high energy $V_{SS}$ connection implant in such a way that the intrinsic source defect density will be reduced.

SUMMARY OF THE INVENTION

According to the present invention, the foregoing and other objects and advantages are obtained by a method of manufacturing flash memory devices having a low energy source implant and a high energy $V_{SS}$ connection implant such that the intrinsic source defect density is reduced and the $V_{SS}$ resistance is low.

In accordance with an aspect of the invention, a first mask is formed exposing source regions and the exposed source regions are implanted with n dopant ions. The first mask is removed and a second mask is formed exposing regions between adjacent source regions and the exposed regions are implanted with $n^+$ dopant ions.

The described method thus provides flash memory devices having a low intrinsic source defect density with a low $V_{SS}$ resistance.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1A is a top view of a portion of a flash memory device showing the position of a first source mask formed on a portion of the flash memory device;

FIG. 1B is a cross sectional view through two adjacent transistors in the portion of the flash memory device shown in FIG. 1A and the portion of the flash memory device being implanted with n ions;

FIG. 1C is a top view of a portion of a flash memory device showing the position of a second source mask formed on the portion of the flash memory device as shown in FIG. 1A;

FIG. 1D is a cross sectional view through the source regions and $V_{SS}$ lines of the portion of the flash memory device shown in FIG. 1C and being implanted with n⁺ ions.

DETAILED DESCRIPTION

Reference is now made in detail to a specific embodiment or specific embodiments of the present invention that illustrate the best mode or modes presently contemplated by the inventors for practicing the invention.

Figure 1A:
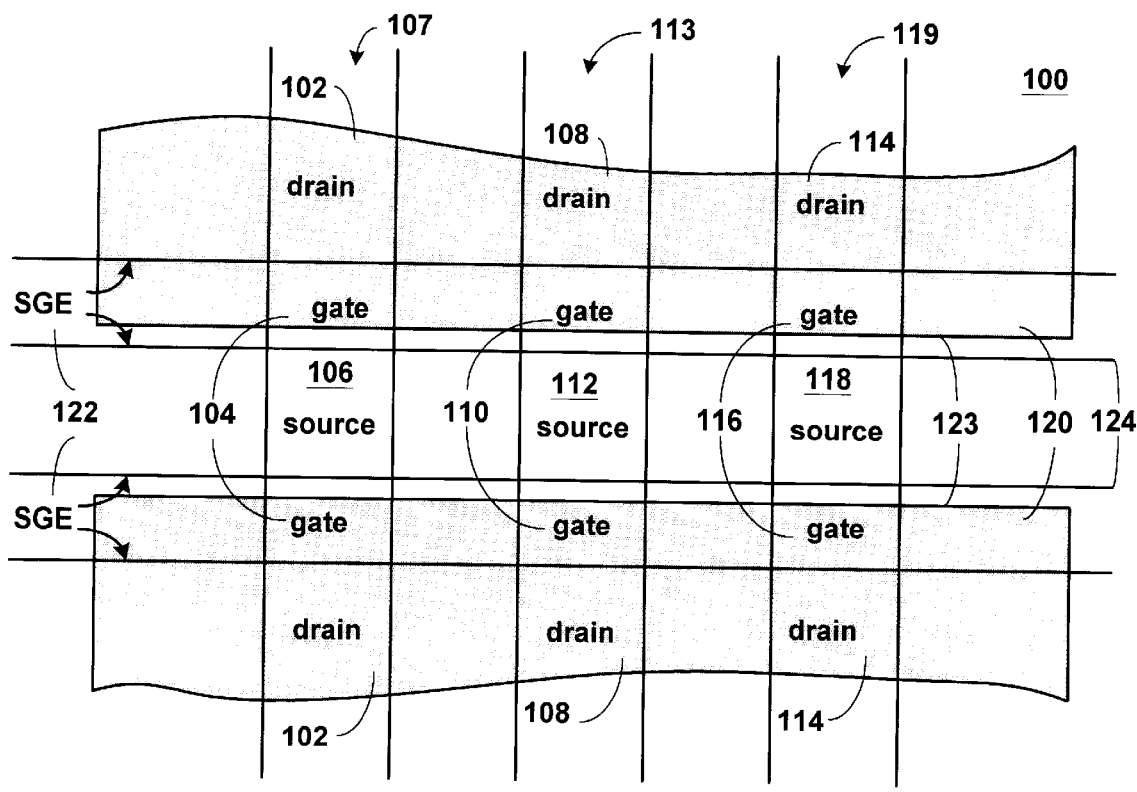
FIGS. 1A–1D show the method of manufacturing a flash memory device in accordance with the present invention.

FIGS. 1A–1E show a method of manufacturing a flash memory device in accordance with the present invention. FIG. 1A is a top view of a portion 100 of a semiconductor flash memory. The portion 100 of the semiconductor flash memory shows the drain regions 102, the gates 104, and the shared source region 106 of a first pair of transistors 107, the drain regions 108, the gates 110, and the shared source region 112 of a second pair of transistors 113, and the drain regions 114, the gates 116, and the shared source region 118 of a third pair of transistors 119. The shaded portion indicates a first source mask 120 formed on the portion 100 of the semiconductor flash memory. The lines (Stacked Gate Edge) SGE 122 indicate the edges of the gates 104, 110 and 116. The edges 123 of the shaded portion of the first source mask 120 do not coincide with the edges 124 of the SGE 122 adjacent the shared source regions 106, 112 and 118. The first source mask 120 is designed to expose a portion of the gates 104, 110 and 116. This allows a tolerance for a misalignment of the mask to ensure that the implantation of dopant ions extends up to the junction defined by the gates 104, 110, and 116.

Figure 1B:
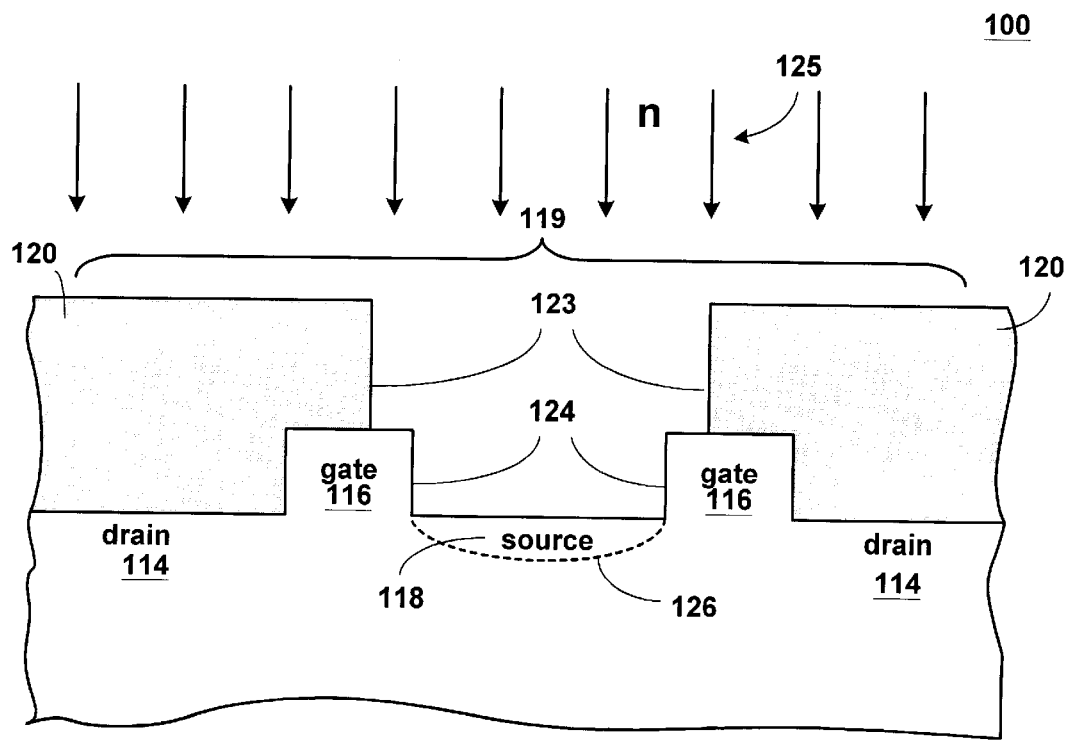

FIG. 1B is a cross sectional view of the portion 100 of the semiconductor memory as shown in FIG. 1A showing the drain regions 114, the gates 116 and the shared source 118 of the third pair of transistors 119. The portion 100 of the semiconductor memory is shown being implanted with n ions indicated by the arrows 125. The dotted line 126 indicates the initial profile of the n ions as implanted into the source region. Also indicated is that the edges 123 of the first source mask 120 do not coincide with the edges 124 of the gates 116.

Figure 1C:
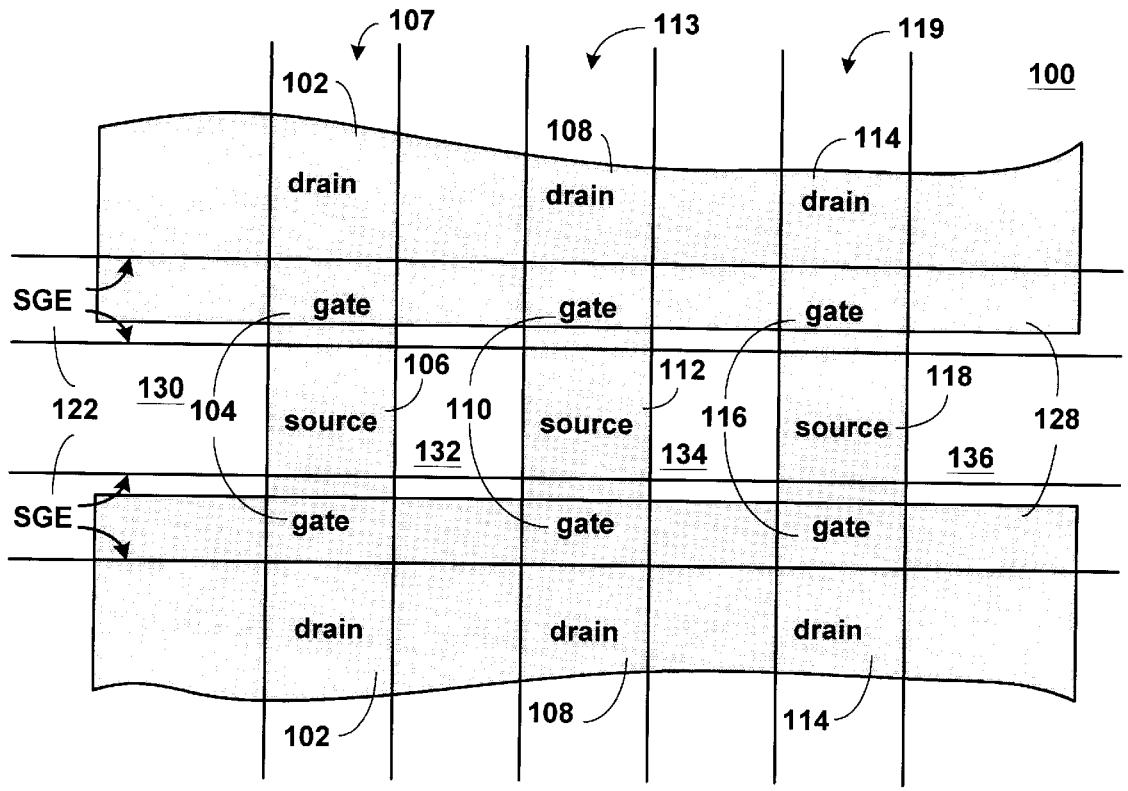

FIG. 1C is a top view of the portion 100 of the semiconductor flash memory as shown in FIG. 1A with the first source mask 120 removed and a second source mask 128 formed that exposes only the $V_{SS}$ regions 130, 132, 134, and 136 on the sides of the source regions 106, 112, and 136, respectively.

Figure 1D:
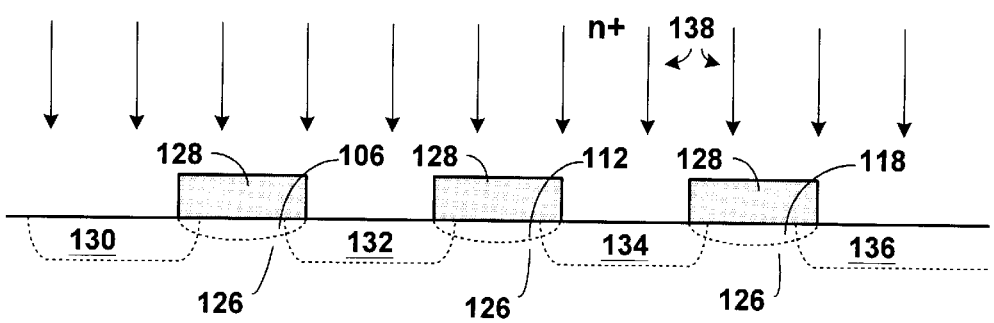

FIG. 1D is a cross sectional view through the source regions 106, 112, and 118 and the regions 130, 132, 134, and 136 that will form the $V_{SS}$ line connecting the source regions 106, 112, and 118 (and other source regions) to the source voltage terminal $V_{SS}$ (not shown). Also shown are n⁺ ions being implanted into the $V_{SS}$ regions 130, 132, 134, and 136.

Figure 1E:
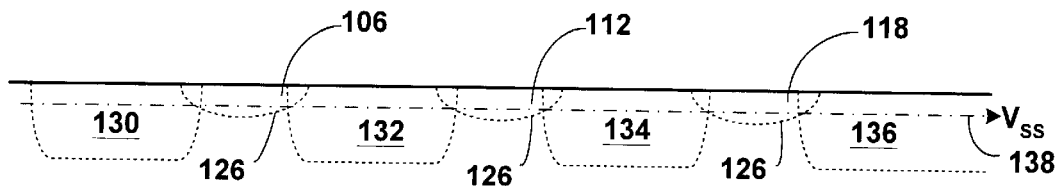
FIG. 1E is the cross sectional view of the portion of the flash memory device as shown in FIG. 1D with the second source mask removed and after an anneal process that drives the n and n⁺ ions into the substrate to form the final dopant profile.

FIG. 1E is the cross sectional view as shown in FIG. 1D after the second source mask 128 has been removed and after an anneal process that drives the n and n⁺ ions into the substrate to form the final dopant profile.

The described method thus provides flash memory devices having a low intrinsic source defect density with a low $V_{SS}$ resistance.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a flash memory Electrically-Erasable Programmable Read-Only Memory (EEPROM) device having a low energy source implant and a high energy $V_{SS}$ connection implant such that the intrinsic source defect density is reduced and the $V_{SS}$ resistance is low, wherein the EEPROM includes a multitude of field effect transistor memory cells each having a source, a drain, a gate and a substrate, the method comprising:

(a) forming multiple gates on a substrate defining drain regions and source regions associated with each of the multiple gates;

(b) forming a first source mask exposing the source regions and portions of the gates;

(c) implanting the exposed source regions with n dopant ions;

(d) removing the first source mask;

(e) forming a second source mask exposing regions between adjacent source regions and masking drain regions;

(f) implanting the exposed regions between adjacent source regions with n⁺ ions; and (g) removing the second source mask.

2. The method of claim 1 further comprising annealing the device wherein the n and n⁺ ions are driven into the substrate forming a final n dopant profile in the source regions and forming a final n⁺ dopant profile in regions that form $V_{SS}$ connections between the source regions.

3. The method of claim 1 wherein step (c) is accomplished by implanting n dopant ions at a low dosage and at low energy.

4. The method of claim 1 wherein step (f) is accomplished by implanting n dopant ions at a high dosage and at high energy.

* * * * *